(12) United States Patent
Yang et al.

(10) Patent No.: US 12,482,747 B2
(45) Date of Patent: Nov. 25, 2025

(54) LOCAL INTERCONNECTS HAVING DIFFERENT MATERIAL COMPOSITIONS

(71) Applicant: International Business Machines Corporation, Armonk, NY (US)

(72) Inventors: Chih-Chao Yang, Glenmont, NY (US); Daniel Charles Edelstein, White Plains, NY (US); Theodorus E. Standaert, Clifton Park, NY (US); Jon Slaughter, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 771 days.

(21) Appl. No.: 17/551,675

(22) Filed: Dec. 15, 2021

(65) Prior Publication Data

US 2023/0187349 A1 Jun. 15, 2023

(51) Int. Cl.
*H01L 23/528* (2006.01)
*H01L 21/768* (2006.01)
*H10N 70/00* (2023.01)

(52) U.S. Cl.
CPC ...... *H01L 23/528* (2013.01); *H01L 21/76877* (2013.01); *H10N 70/021* (2023.02); *H10N 70/801* (2023.02)

(58) Field of Classification Search
CPC ............ H01L 23/528; H01L 21/76877; H01L 21/76834; H01L 21/76883; H01L 21/76885; H01L 23/5226; H10N 70/021; H10N 70/801; H10N 70/063; H10N 70/20; H10N 70/231; H10N 70/826; H10N 70/8833; H10N 70/8828; H10B 53/00; H10B 63/10; H10B 63/80; H10B 61/00

See application file for complete search history.

(56) References Cited

U.S. PATENT DOCUMENTS

| 6,876,574 | B2 | 4/2005 | Giebeler |
| 7,184,853 | B2 | 2/2007 | Roberts |
| 7,208,808 | B2 | 4/2007 | Lee |

(Continued)

FOREIGN PATENT DOCUMENTS

WO 2019079553 A1 4/2019

OTHER PUBLICATIONS

Nguyen et al., "Novel approach for nano-patterning magnetic tunnel junctions stacks at narrow pitch: A route towards high density STT-MRAM applications", 2017 IEEE International Electron Devices Meeting (IEDM), Dec. 2017, San Francisco, CA, United States, 10.1109/IEDM.2017.8268517, hal-01763666, 5 pages.

*Primary Examiner* — Ratisha Mehta
*Assistant Examiner* — Sophia W Kao
(74) *Attorney, Agent, or Firm* — Aaron N. Pontikos

(57) ABSTRACT

A semiconductor device and formation thereof. The semiconductor device including: a first bottom interconnect formed within a first dielectric layer and located within a logic area of the semiconductor device; a second bottom interconnect formed within the first dielectric layer and located within a memory area of the semiconductor device; and a memory device formed on top of the second bottom interconnect located within the memory area of the semiconductor device, wherein: a first metal material used to form the first bottom interconnect located in the logic area is different than a second metal material used to form the second bottom interconnect located in the memory area.

20 Claims, 12 Drawing Sheets

(56) References Cited

U.S. PATENT DOCUMENTS

| | | |
|---|---|---|
| 7,223,612 B2 | 5/2007 | Sarma |
| 7,419,882 B2 | 9/2008 | Wu |
| 7,442,624 B2 | 10/2008 | Sarma |
| 7,545,740 B2 | 6/2009 | Zelig |
| 7,674,717 B2 | 3/2010 | Wang |
| 7,678,659 B2 | 3/2010 | Tu |
| 9,893,121 B2 | 2/2018 | Sonoda |
| 10,490,248 B2 | 11/2019 | Chuang |
| 2018/0248111 A1 | 8/2018 | Raghavan |
| 2019/0164584 A1* | 5/2019 | Chuang .................. H10N 50/85 |
| 2020/0388757 A1* | 12/2020 | Yang .................... H10N 70/826 |
| 2021/0273156 A1* | 9/2021 | Chen ...................... H10N 50/80 |
| 2021/0358801 A1* | 11/2021 | Dutta ................. H01L 21/76834 |
| 2021/0390993 A1* | 12/2021 | Wang ..................... H10N 50/01 |
| 2022/0029087 A1* | 1/2022 | Chen ...................... H10B 61/00 |
| 2022/0115587 A1* | 4/2022 | Wang .................... H10N 50/80 |
| 2022/0376166 A1* | 11/2022 | Kuo ....................... H10N 50/01 |
| 2023/0081953 A1* | 3/2023 | Sharma ............. H01L 21/76885 |
| | | 257/107 |

* cited by examiner

LOCAL INTERCONNECTS HAVING DIFFERENT MATERIAL COMPOSITIONS

BACKGROUND OF THE INVENTION

The present invention relates generally to the field of semiconductor devices, and more particularly to local interconnects of a logic area of a semiconductor device being formed from a different metal material than local interconnects of a memory area of the semiconductor device.

As integrated circuits move to smaller technology nodes, simultaneous patterning of interconnect(s) and devices in various areas of a semiconductor device becomes increasingly challenging. Generally, local interconnects are the first, or lowest, level of interconnects, and are typically used to connect gates, sources, and drains in metal-oxide-silicon technologies.

SUMMARY

According to one embodiment of the present invention, a semiconductor device is provided. The semiconductor device includes a first bottom interconnect formed within a first dielectric layer and located within a logic area of the semiconductor device. The semiconductor device further includes a second bottom interconnect formed within the first dielectric layer and located within a memory area of the semiconductor device. A first metal material used to form the first bottom interconnect located in the logic area is different than a second metal material used to form the second bottom interconnect located in the memory area. The semiconductor device further includes a memory device formed on top of the second bottom interconnect located within the memory area of the semiconductor device.

According to another embodiment of the present invention, a method of forming a semiconductor device is disclosed. The method includes forming a first bottom interconnect and a second bottom interconnect in a first dielectric layer, in which the first bottom interconnect and the second bottom interconnect formed in the first dielectric layer are located in a logic area and a memory area, respectively, of the semiconductor device, and the first bottom interconnect located in the logic area is formed from a first metal material that is different than a second metal material used to form the second bottom interconnect located in the memory area. The method further includes forming a memory device on top of the second bottom interconnect located in the memory area.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which:

When viewed as ordered combinations, FIGS. 1-18 illustrate both (i) semiconductor devices and (ii) the methods for forming such semiconductor devices, in accordance with illustrative embodiments.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
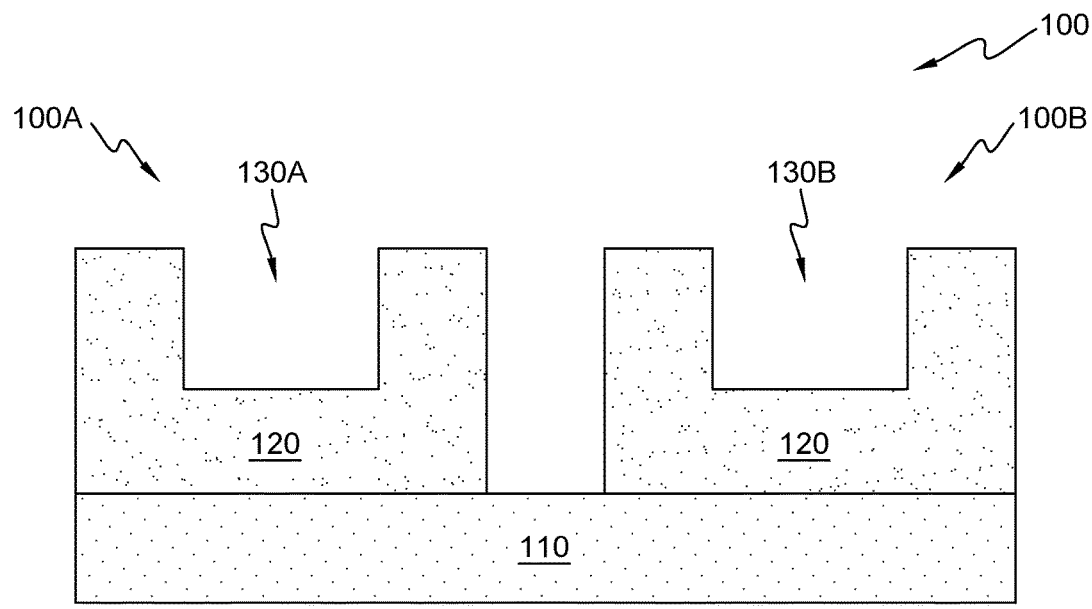
FIG. 1 illustrates a cross-sectional view of a semiconductor structure, generally designated 100, after forming respective openings in a logic layer and a memory layer of semiconductor device 100, in accordance with at least one embodiment of the present invention.

Embodiments of the present invention recognize that the material used to form local interconnects underneath memory devices may negatively impact the overall performance of a memory device. However, the same local interconnect material that may negatively impact the overall performance of a memory device can be favorable in the formation of local interconnects in a logic area. Accordingly, embodiments of the present invention provide for a semiconductor device having local interconnects of a logic area being formed from a different metal than local interconnects of a memory area. This ultimately provides for the formation of local interconnects in the logic and memory areas using respective metals or metal alloys that maximize overall performance for a given application.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

As described below, in conjunction with FIGS. 1-18, embodiments of the present invention include semiconductor devices and methods of forming such semiconductor devices, and in particular, semiconductor devices having local interconnects of a logic area formed from a different metal than local interconnects of a memory area. The methods described below in conjunction with FIGS. 1-18 may be incorporated into typical semiconductor memory device fabrication processes. As such, when viewed as ordered combinations, FIGS. 1-18 illustrate methods for forming semiconductor devices having local interconnects of a logic area formed from a different metal than local interconnects of a memory area, and thus improved semiconductor memory devices having local interconnects formed in the logic and memory areas using respective metals or metal alloys that maximize the overall performance of the logic and memory areas in accordance with illustrative embodiments of the present invention.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements of various embodiments of the present invention.

As used herein, terms such as "depositing," "forming," and the like may refer to the disposition of layers, or portions of materials, in accordance with a given embodiment. Such processes may or may not be different than those used in the standard practice of the art of microcooler device fabrication. Such processes include, but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition, sputtering, plating, electroplating, evaporation, ion beam deposition, electron beam deposition, laser assisted deposition, chemical solution deposition, or any combination of those methods.

As used herein, terms, such as "forming," and the like, may refer to processes that alter the structure and/or composition of one or more layers of material or portions of materials in accordance with a given embodiment. For example, such formation processes may include, but are not limited to, exposure to a specific frequency or range of frequencies of electromagnetic radiation, ion implantation techniques, and/or chemical/mechanical polishing (CMP). As used herein, terms, such as "forming," and the like, may refer to processes that alter the structure of one or more layers of material, or portions of material(s), by removal of a quantity of material, in accordance with a given embodiment. For example, such formation processes may include, but are not limited to, micromachining, microetching, wet and/or dry etching processes, plasma etching processes, or any of the known etching processes in which material is removed.

Those skilled in the art understand that many different techniques may be used to add, remove, and/or alter various materials, and portions thereof, and that embodiments of the present invention may leverage combinations of such processes to produce the structures disclosed herein without deviating from the scope of the present invention.

The present invention will now be described in detail with reference to the Figures. FIGS. 1-18 include various cross-sectional views depicting illustrative steps of a method for manufacturing semiconductor devices and the resulting semiconductor devices according to select embodiments of the present invention. One having ordinary skill in the art will appreciate that there are many options available for the formation of the structures described herein and that the following discussion does not limit embodiments to only the techniques described herein.

Referring now to FIG. 1, FIG. 1 illustrates a cross-sectional view of a semiconductor structure, generally designated 100, after forming respective openings in a logic area 100A and a memory area 100B of semiconductor structure 100, in accordance with at least one embodiment of the present invention. Semiconductor structure 100 is obtained following the simultaneous patterning of a dielectric layer 120 formed on logic area 100A and memory area 100B of a substrate 110.

In some embodiments, substrate 110 may include a front-end-of-the-line (FEOL) level. A FEOL level is typically present beneath the lowest level of the multilayered interconnect structure and includes a semiconductor substrate having one or more semiconductor devices such as, for example, transistors, capacitors, resistors, and etc. located thereon. In other embodiments, substrate 110 may include one or more interconnect levels of a multilayered interconnect structure. In such an embodiment, each interconnect level may include one or more electrically conductive structures embedded in an interconnect dielectric material. For example, the one or more interconnect levels of a multilayered interconnect structure may be formed from any generally known semiconductor materials, such as silicon, gallium arsenide, or germanium.

Dielectric layer 120 may be composed of an inorganic dielectric material or an organic dielectric material. In some embodiments, dielectric layer 120 may be porous. In other embodiments, dielectric layer 120 may be non-porous. In some embodiments, dielectric layer 120 may have a dielectric constant (all dielectric constants mentioned herein are measured relative to a vacuum, unless otherwise stated) that is about 4.0 or less. In an embodiment, dielectric layer 120 may have a dielectric constant of 2.8 or less. These dielectrics having a dielectric constant of 2.8 or less generally have a lower parasitic cross talk as compared to dielectric materials whose dielectric constant is greater than 4.0. Examples of suitable dielectric materials that may be employed as dielectric layer 120 include, but are limited to, porous silicates, silicon dioxides, silicon oxynitrides, silicon carbides, silicon nitrides, silicon undoped or doped silicate glass, silsesquioxanes, carbon doped oxides (i.e., organosilicates) that include atoms of Si, C, O and H, and variants thereof, siloxanes, thermosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

Dielectric layer 120 can be deposited on substrate 120 using deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), liquid source misted chemical deposition (LSMCD), spin-on coating, sputtering, and/or plating. Dielectric layer 120 can have a thickness from 50 nm to 250 nm. However, other thicknesses that are less than 50 nm, and greater than 250 nm can also be employed in embodiments of the present invention.

At an initial fabrication stage, openings 130A and 130B are conventionally formed in dielectric layer 120 of logic area 100A and memory area 100B by using, for example, known damascene techniques. As an example, photoresist material (not depicted) is deposited onto dielectric layer 120. The photoresist can be applied by any suitable techniques, including, but not limited to, coating or spin-on techniques. A dielectric mask (not depicted), is formed over the photoresist material, followed by etching steps. The dielectric mask is patterned with shapes defining openings 130A and 130B to be formed, and the dielectric mask pattern is transferred to the photoresist material using a lithographic process, which creates recesses in the uncovered regions of the photoresist material. The resulting patterned photoresist material is subsequently used to create the same pattern of openings 130A and 130B in dielectric layer 120. Dry etch techniques (for example, an anisotropic etch process, such as reactive ion etch) may be employed to selectively remove portions of dielectric layer 120 to form openings 130A and 130B extending vertically downwardly through dielectric layer 120 and towards substrate 110. The depth(s) of openings 130A and 130B can be controlled by using a timed etching process. After formation of openings 130A and 130B, the photoresist may be stripped from dielectric layer 120 by ashing or other suitable processes. The resulting structure may be subjected to a wet clean.

As depicted in FIG. 1, openings 130A and 130B are via structures. However, in other embodiments, openings 130A and 130B may be trench and via structures, or any possible combination thereof. In some embodiments, and as shown, openings 130A and 130B may extend partially through dielectric layer 120. In other embodiments, openings 130A and 130B may extend through the entire depth of dielectric layer 120. In various embodiments, openings 130A and 130B may have the same depth or different depths.

Figure 2:
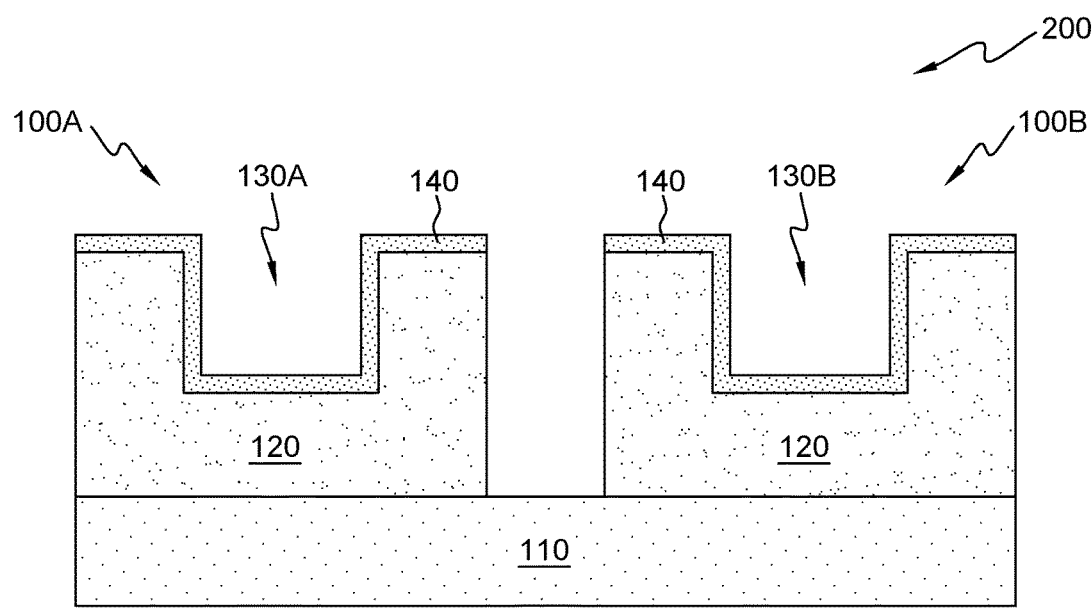
FIG. 2 illustrates a cross-sectional view of semiconductor structure 100 depicted in FIG. 1 after performing subsequent processing steps, generally designated 200, in accordance with at least one embodiment of the present invention.

FIG. 2 illustrates a cross-sectional view of semiconductor structure 100 depicted in FIG. 1 after performing subsequent processing steps, generally designated 200, in accordance with at least one embodiment of the present invention. In some embodiments, and as depicted by semiconductor structure 200 of FIG. 2, an optional metal liner 140 is conformally deposited on the exposed surfaces of the patterned dielectric layer 120 formed in logic area 100A and memory area 100B. Metal liner 140 may include one or more thin layers of material such as, for example, tantalum (Ta), tantalum nitride (TaN), titanium nitride (TiN), cobalt (Co), ruthenium (Ru), tungsten (W), tungsten nitride (WN), titanium-tungsten (TiW), tungsten nitride (WN) manganese (Mn), manganese nitride (MnN) or other liner materials (or combinations of liner materials) such as RuTaN, Ta/TaN, CoWP, NiMoP, NiMoB which are suitable for the given application. The thin metal liner serves as a barrier diffusion layer and adhesion layer. A conformal layer of metal liner 140 may be deposited using known techniques including, but not limited to, chemical vapor deposition (CVD), plasma enhanced chemical vapor deposition (PECVD), atomic layer deposition (ALD), physical vapor deposition (PVD), sputtering, chemical solution deposition or plating. The thickness of metal liner 140 may vary depending on the deposition process used, as well as the material employed. In some embodiments, metal liner 140 may have a thickness from 2 nm to 50 nm. However, other thicknesses that are less than 2 nm, and greater than 50 nm can also be employed in embodiments of the present invention, as long as metal liner 140 does not entirely fill openings 130A and 130B.

In some embodiments, an optional plating seed layer (not depicted) can be formed on metal liner 140 as well. The optional plating seed layer is employed to selectively promote subsequent electroplating of a pre-selected conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, a Cu or Cu alloy plating seed layer is employed when a Cu metal is to be subsequently formed within openings 130A and 130B. The optional plating seed layer can be formed by a conventional deposition process including, for example, CVD, PECVD, ALD, or PVD. The thickness of the optional plating seed layer may vary depending on the material of the optional plating seed layer, as well as the technique used in forming the same. Typically, the optional plating seed layer may have a thickness from 2 nm to 80 nm. However, other thicknesses that are less than 2 nm, and greater than 80 nm can also be employed in embodiments of the present invention, as long as the optional plating seed layer does not entirely fill openings 130A and 130B.

Figure 3:
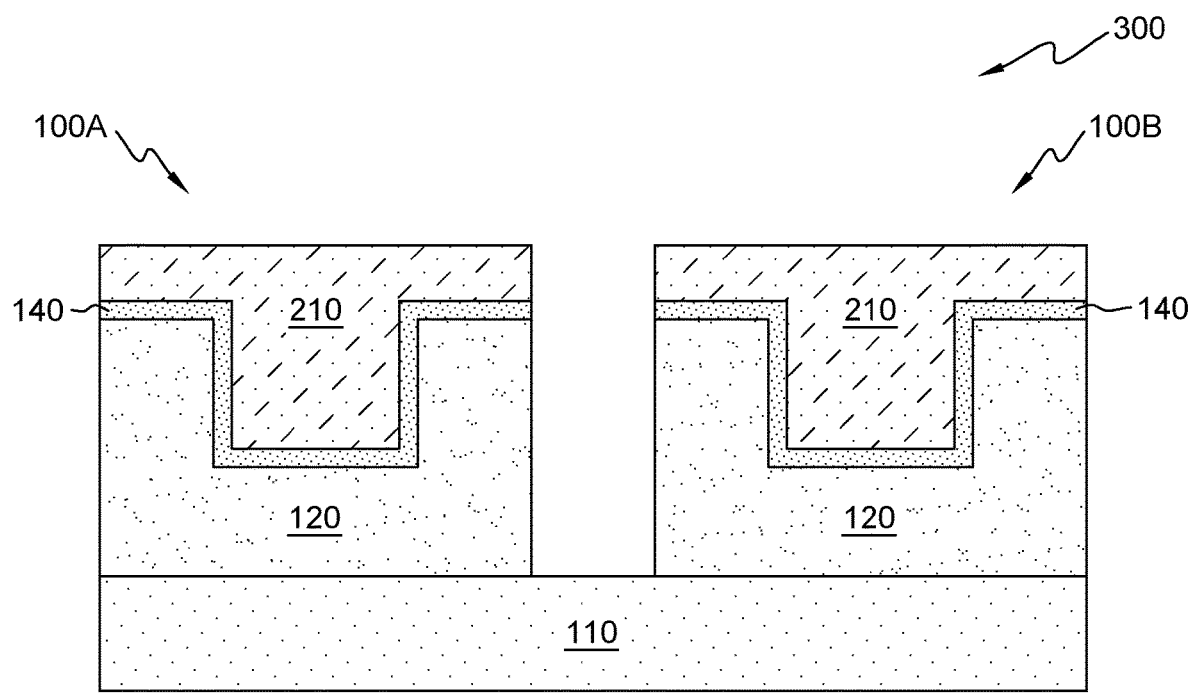
FIG. 3 illustrates a cross-sectional view of semiconductor structure 200 depicted in FIG. 2 after performing subsequent processing steps, generally designated 300, in accordance with at least one embodiment of the present invention.

FIG. 3 illustrates a cross-sectional view of semiconductor structure 200 depicted in FIG. 2 after performing subsequent processing steps, generally designated 300, in accordance with at least one embodiment of the present invention. Semiconductor structure 300 of FIG. 3 is obtained by simultaneously depositing a metal filler 210 (e.g., via atomic layer deposition, chemical vapor deposition, plating, electroplating, or any other suitable deposition techniques) on the exposed surfaces of metal liner 140 in logic area 100A and memory area 100B. Specifically, metal filler 210 is formed such that openings 130A and 130B are filled with metal filler 210 until metal filler 210 is at least substantially coplanar with a top surface of dielectric layer 120.

In an embodiment, metal filler 210 is a ferromagnetic material. In an embodiment, metal filler 210 is a non-ferromagnetic material. In an embodiment, metal filler 210 may be a metal or metal alloy including, but is not limited to, ruthenium (Ru), cobalt (Co), rhodium (Rh), iridium (Jr), tungsten (W), and molybdenum (Mo).

Metal filler 210 can be formed utilizing a deposition process such as, for example, CVD, PECVD, sputtering, chemical solution deposition or plating. In those embodiments in which metal liner 140 is not used, metal filler 210 is deposited directly onto the exposed surfaces of dielectric layer 120 in logic area 100A and memory area 100B.

In an embodiment, a thermal annealing process is performed after metal filler 210 is formed within and filling openings 130A and 130B. For example, the thermal annealing can be a furnace anneal, rapid thermal anneal, flash anneal, or laser anneal. In an embodiment, for furnace anneal and rapid thermal anneal, the annealing temperature can range from 150° C. to 450° C. for furnace anneal and rapid thermal anneal and the anneal duration can range from 10 minutes to one hour. In an embodiment, for flash anneal/laser anneal, the annealing temperature can be higher (e.g., from 450° C. to 1000° C.), but the anneal duration is much shorter (e.g., ranging from 100 nanoseconds to 100 milliseconds).

Figure 4:
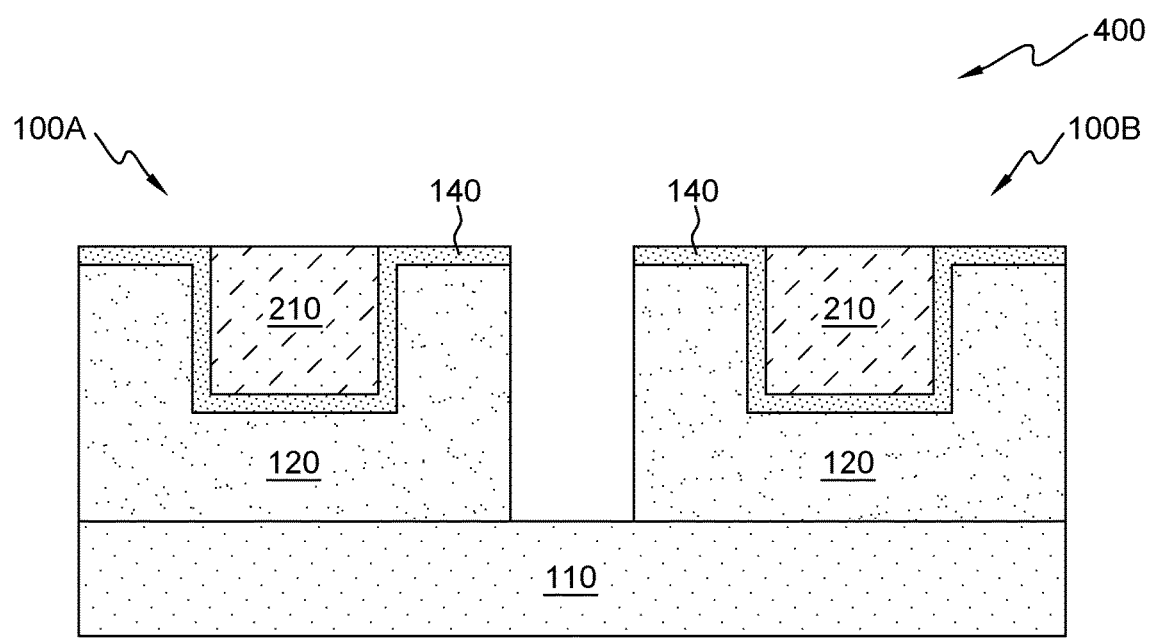
FIG. 4 illustrates a cross-sectional view of semiconductor structure 300 depicted in FIG. 1 after performing subsequent processing steps, generally designated 400, in accordance with at least one embodiment of the present invention.

FIG. 4 illustrates a cross-sectional view of semiconductor structure 300 depicted in FIG. 3 after performing subsequent processing steps, generally designated 400, in accordance with at least one embodiment of the present invention. Semiconductor structure 400 of FIG. 4 is obtained following a planarization process such as, for example, chemical mechanical planarization or polishing (CMP) and/or grinding, used to remove portions of metal liner 140 and metal filler 210 (collectively referred to as "overburden material") that are present outside of openings 130A and 130B. The planarization stops at the top surface of dielectric layer 120, such that metal liner 140 and metal filler 210 are substantially coplanar with the top surface of dielectric layer 120.

Figure 5:
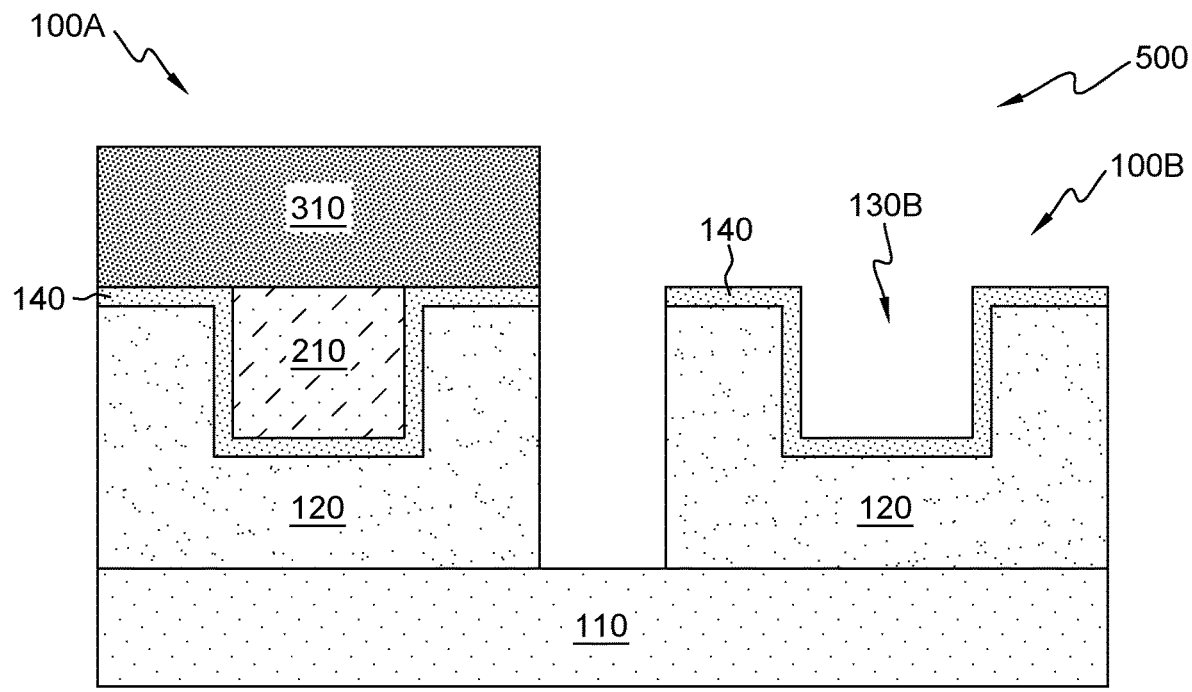
FIG. 5 illustrates a cross-sectional view of semiconductor structure 400 depicted in FIG. 4 after performing alternative subsequent processing steps, generally designated 500, in accordance with at least one embodiment of the present invention.

FIG. 5 illustrates a cross-sectional view of semiconductor structure 400 depicted in FIG. 4 after performing subsequent processing steps, generally designated 500, in accordance with at least one embodiment of the present invention. Semiconductor structure 500 of FIG. 5 is obtained after formation of a hard mask 310 onto the exposed surfaces of logic area 100A of semiconductor structure 400 depicted in FIG. 4. Hard mask 310 protects the underlying structure of logic area 100A, including metal filler 210 and metal liner 140 adjoining metal filler 210, and dielectric layer 120.

Hard mask 310 may be composed of any metal-containing hard mask material including, but not limited to metals (e.g., aluminum (Al), tungsten (W), tantalum (Ta), and titanium (Ti)), metal nitrides tungsten nitride (WN), tantalum nitride (TaN), and titanium nitride (TiN), or any combination thereof. Hard mask 310 may be formed utilizing a deposition process including, but not limited to, CVD, PECVD, ALD, PVD, or sputtering. Hard mask 310 may have a thickness from 20 nm to 150 nm. However, other thicknesses that are less than 20 nm, and greater than 150 nm can also be employed in embodiments of the present invention.

As further depicted by semiconductor structure 500 of FIG. 5, metal filler 210 in memory area 100B has been removed utilizing one or more material removal processes (e.g., reactive ion etchings (RIE), chemical wet etching, or a combination thereof). In an embodiment, metal filler 210 in memory area 100B is removed using an etchant that is selective to the material of metal filler 210. The removal of metal filler 210 in memory area 100B results in opening 130B. It should be noted that metal filler 210 in logic area 100A is protected by hard mask 310 and thus, metal filler has not been removed from logic area 100A.

After selectively removing metal filler 210 from memory area 100B, hard mask 310 is removed utilizing one or more material removal processes. For example, hard mask 310 can be removed utilizing a planarization process, such as, for example, chemical mechanical polishing and/or grinding.

Figure 6:
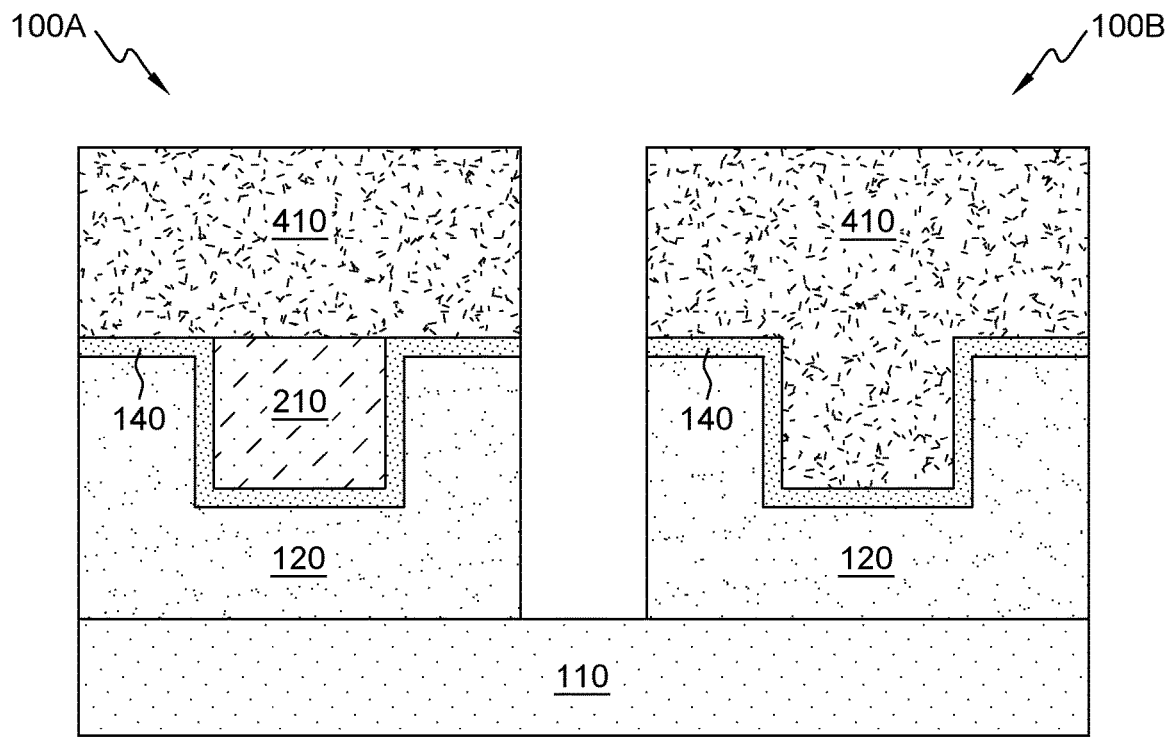
FIG. 6 illustrates a cross-sectional view of semiconductor structure 500 depicted in FIG. 5 after subsequent processing steps, generally designated 600, in accordance with at least one embodiment of the present invention.

FIG. 6 illustrates a cross-sectional view of semiconductor structure 500 depicted in FIG. 5 after subsequent processing steps, generally designated 600, in accordance with at least one embodiment of the present invention. Semiconductor structure 600 of FIG. 6 is obtained following a conformal deposition (e.g., via PVD, CVD, ALD, electroless, or reflow) of a metal filler 410 onto the exposed surfaces of logic area 100A and memory area 100B of semiconductor structure 500 depicted in FIG. 5. Specifically, metal filler 410 is formed in memory area 100B such that opening 130B (depicted in FIG. 5) is filled with metal filler 410 until metal filler 410 is at least substantially coplanar with the top surface of dielectric layer 120. In an embodiment, metal filler 410 is also deposited onto the exposed surfaces (including the top surface of metal filler 210 and the top surface of metal liner 140) of logic area 100A.

It should be noted that in any embodiment of the present invention, metal filler 410 is composed of a different metal or metal alloy than metal filler 210. In an embodiment, metal filler 410 is a non-ferromagnetic material. In an embodiment, metal filler 410 may be a metal or metal alloy including, but not limited to, copper (Cu), aluminum (Al), ruthenium (Ru), rhodium (Rh), iridium (Jr), tungsten (W), and molybdenum (Mo).

Metal filler 410 can be formed utilizing a deposition process such as, for example, CVD, PECVD, sputtering, chemical solution deposition or plating. In those embodiments in which metal liner 140 is not used, metal filler is deposited directly onto the exposed surfaces of dielectric layer 120 in memory area 100B.

Figure 7:
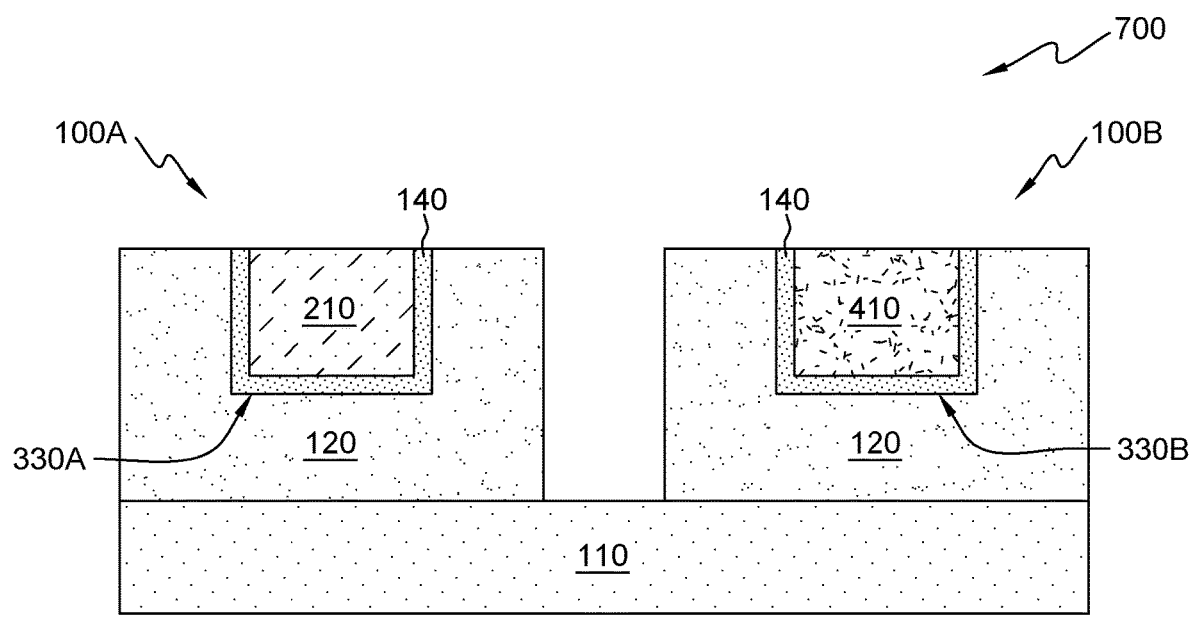
FIG. 7 illustrates a cross-sectional view of semiconductor structure 600 depicted in FIG. 6 after subsequent processing steps, generally designated 700, in accordance with at least one embodiment of the present invention.

FIG. 7 illustrates a cross-sectional view of semiconductor structure 600 depicted in FIG. 6 after subsequent process steps, generally designated 700, in accordance with at least one embodiment of the present invention. Semiconductor structure 700 of FIG. 7 is obtained following a planarization process such as, for example, chemical mechanical planarization or polishing (CMP) and/or grinding, to remove metal filler 410 from logic area 100A and any metal filler 410 overburden material formed outside of opening 130B of memory area 100B. The planarization stops at the top surface of dielectric layer 120 such that metal filler 410 is completely removed from logic area 100A, and the top surface of metal filler 210 in logic area 100A and metal filler 410 in memory area 100B are substantially coplanar with the top surface of dielectric layer 120.

In an embodiment, the remaining portion of metal filler 210 and the remaining portion of metal liner 140 adjacent to metal filler 210 form bottom interconnect 330A. Similarly, the remaining portion of metal filler 410 and the remaining portion of metal liner 140 adjacent to metal filler 410 form bottom interconnect 330B. In an embodiment, bottom interconnects 330A and 330B are local interconnects. In an embodiment, bottom interconnects 330A and 330B are semi-global interconnects. It should be appreciated that at this stage in the fabrication process, bottom interconnect 330A is an electrically conductive structure formed from metal filler 210 and bottom interconnect 330B is an electrically conductive structure formed from metal filler 410.

Figure 8:
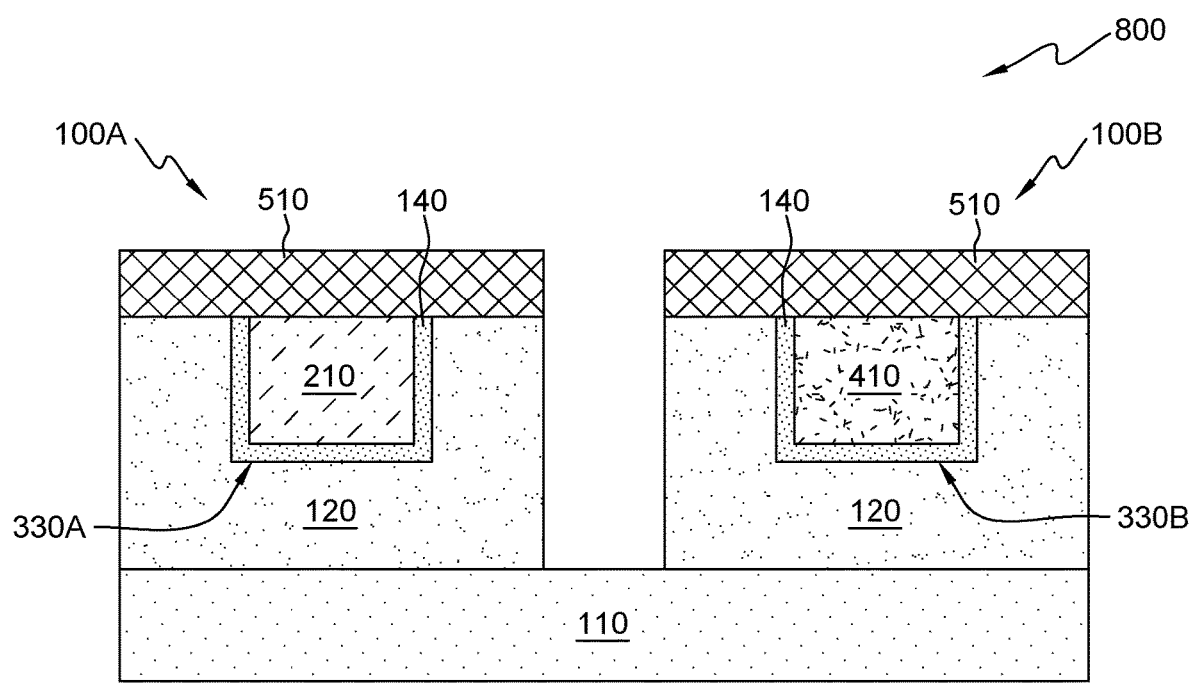
FIG. 8 illustrates a cross-sectional view of semiconductor structure 700 depicted in FIG. 7 after subsequent processing steps, generally designated 800, in accordance with at least one embodiment of the present invention.

FIG. 8 illustrates a cross-sectional view of semiconductor structure 700 depicted in FIG. 7 after subsequent process steps, generally designated 800, in accordance with at least one embodiment of the present invention. Semiconductor structure 800 of FIG. 8 is obtained following deposition of an insulator layer 510 onto the exposed surfaces of logic area 100A and memory area 100B of semiconductor structure 700 depicted in FIG. 7. Insulator layer 510 can be deposited using deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), spin-on coating, sputtering, and/or plating. Insulator layer 510 can include, but is not limited to, silicon dioxides (SiO2), silicon nitrides (Si3N4), silicon carbides (SiC), nitrogen-hydrogen doped silicon carbides (SiC)(N,H), or any other insulators which are suitable for the given application.

Figure 9:
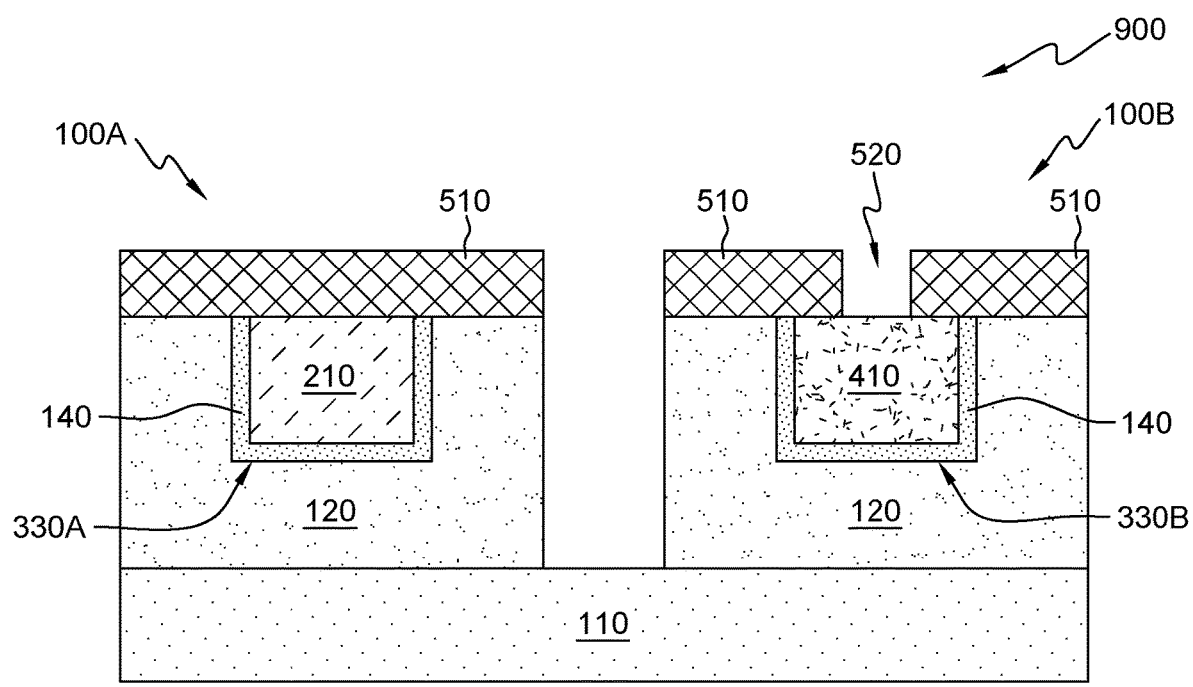
FIG. 9 illustrates a cross-sectional view of semiconductor structure 800 depicted in FIG. 8 after subsequent processing steps, generally designated 900, in accordance with at least one embodiment of the present invention.

FIG. 9 illustrates a cross-sectional view of semiconductor structure 800 depicted in FIG. 8 after subsequent process steps, generally designated 900, in accordance with at least one embodiment of the present invention. Semiconductor structure 900 of FIG. 9 is obtained following formation of an opening 520 in insulator 510 of memory area 100B.

Following the formation of insulator layer 510, a patterned hard mask (not depicted) is formed by depositing a hard mask layer (not depicted) on insulator 510 formed in logic area 100A and memory area 100B, and patterning the hard mask layer using a patterned photoresist layer (not depicted), followed by etching. As an example, a hard mask layer (not depicted) is deposited onto the exposed surfaces of semiconductor structure 800 depicted in FIG. 8. The hard mask layer can be formed utilizing a deposition process including, but not limited to, CVD, PECVD, ALD, physical vapor deposition (PVD) or sputtering. The hard mask layer may be composed of any metal-containing hard mask material such as, for example, titanium nitride or tantalum nitride.

A photoresist material (not depicted) is deposited onto the hard mask layer. The photoresist can be applied by any suitable techniques, including, but not limited to, coating or spin-on techniques. A dielectric mask (not depicted), is formed over the photoresist material, followed by etching steps. The dielectric mask, which is patterned with shapes defining the patterned hard mask to be formed, is formed on the photoresist material, and the dielectric mask pattern is transferred to the photoresist material using a lithographic process, which creates recesses in the uncovered regions of the photoresist material. The resulting patterned photoresist material is subsequently used to create the same pattern in the hard mask layer. Dry etch techniques (for example, an anisotropic etch process, such as reactive ion etch) may be employed to selectively remove portions of the hard mask layer to form the patterned hard mask. After formation of patterned hard mask, the photoresist material may be stripped from the patterned hard mask by ashing or other suitable processes. The resulting structure may be subjected to a wet clean.

The resulting patterned hard mask is formed such that a portion of the underlying structure of memory area 100B corresponding to opening 520 to be formed is left exposed, while the remaining portion of the underlying structure of memory area 100B and the entire underlying structure of logic area 100a are protected by the patterned hard mask. The patterned hard mask may have a thickness from 20 nm to 150 nm. However, other thicknesses that are less than 20 nm, and greater than 150 nm can also be employed in embodiments of the present invention.

Opening 520 in insulator layer 510 of memory area 100B is formed utilizing the patterned hard mask as an etch mask. During patterning of insulator layer 510 of memory area 100B, the physically exposed portion of insulator layer 510 of memory area 100B is removed by an anisotropic etching process such as, for example, reactive ion etching (RIE), ion beam etching (IBE), chemical wet etching, or a combination of IBE and chemical wet etching. The etch removes the portion of insulator layer 510 of memory area 100B that is not protected by the patterned hard mask to form opening 520 in insulator layer 510 of memory area 100B. As depicted by semiconductor structure 900 of FIG. 9, opening 520 extends vertically downwardly through insulator layer 510 and exposes at least a portion of the top surface of bottom interconnect 130B of memory area 100B.

After forming opening 520 in insulator layer 510 of memory area 100B, the patterned hard mask can be removed utilizing one or more material removal processes. For example, the patterned hard mask can be removed utilizing a planarization process such as, for example, chemical mechanical polishing and/or grinding.

Figure 10:
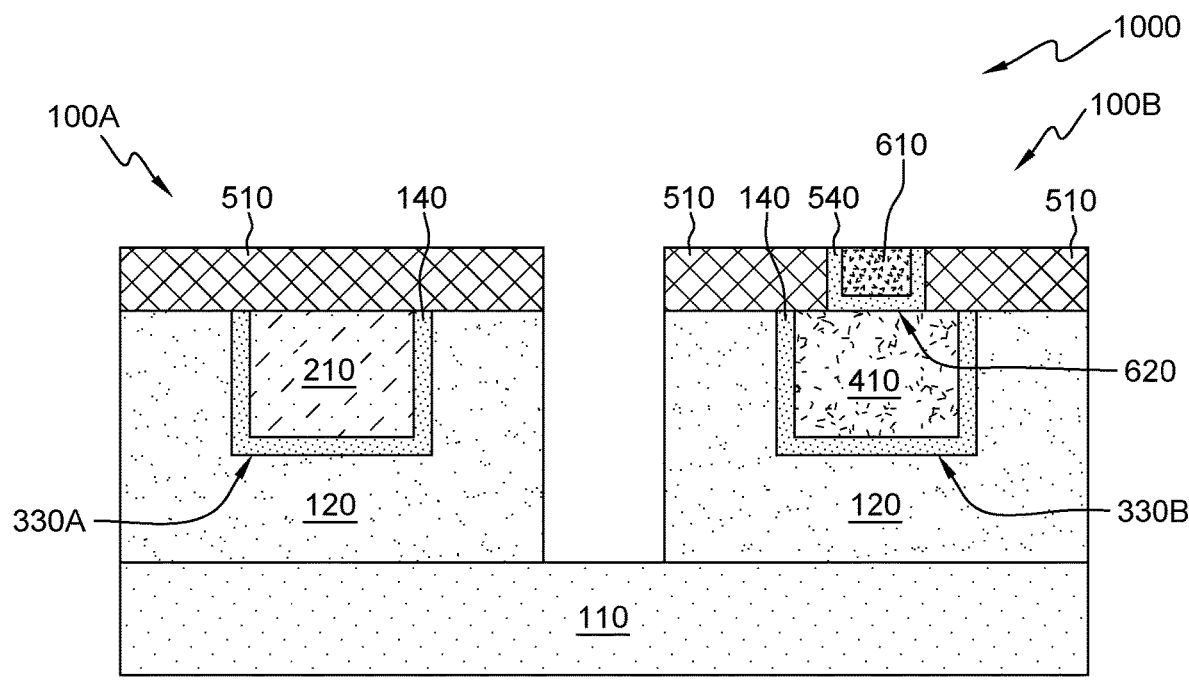
FIG. 10 illustrates a cross-sectional view of semiconductor structure 900 depicted in FIG. 9 after subsequent processing steps, generally designated 1000, in accordance with at least one embodiment of the present invention.

FIG. 10 illustrates a cross-sectional view of semiconductor structure 900 depicted in FIG. 9 after subsequent process steps, generally designated 1000, in accordance with at least one embodiment of the present invention. Semiconductor structure 1000 of FIG. 10 is obtained following formation of a metal plug 610 in memory area 100B.

Following removal of the patterned hard mask, and as depicted in FIG. 10, an optional metal liner 540 is conformally deposited onto the exposed surfaces of memory area 100B using one of the deposition processes mentioned above for forming metal liner 140 within openings 130A and 130B (depicted in FIG. 2). A metal filler 610 is then deposited onto the exposed surfaces of metal liner layer 540 of memory area 100B. Specifically, metal filler 610 is formed such that opening 520 (depicted in FIG. 9) formed within insulator layer 510 of memory area 100B is filled with metal filler 610 until metal filler 610 is at least substantially coplanar with the top surface of insulator layer 510. Any overburden metal filler 610 formed outside of opening 520 may subsequently be removed using a planarization process such as, for example, CMP and/or grinding, which results in the final metal plug structure. The planarization stops at the top surface of dielectric layer 120, such that the top surface of metal filler 610 is substantially coplanar with the top surface of dielectric layer 120. The remaining metal filler 610 and the remaining metal liner 540 adjacent to metal filler 610 form metal plug 620.

In an embodiment, metal filler 610 may be composed of, for example, copper (Cu), tungsten (W), aluminum (Al), tantalum nitride (TaN), or titanium nitride (TiN). Metal filler 610 can be formed using one of the deposition processes mentioned above for forming metal filler 210 within openings 130A and 130B (depicted in FIG. 3), followed by a thermal annealing process and planarization process as described above. As depicted in FIG. 10, metal plug 620 is formed onto, and is in direct electrical contact with interconnect 330B of memory area 100B.

Figure 11:
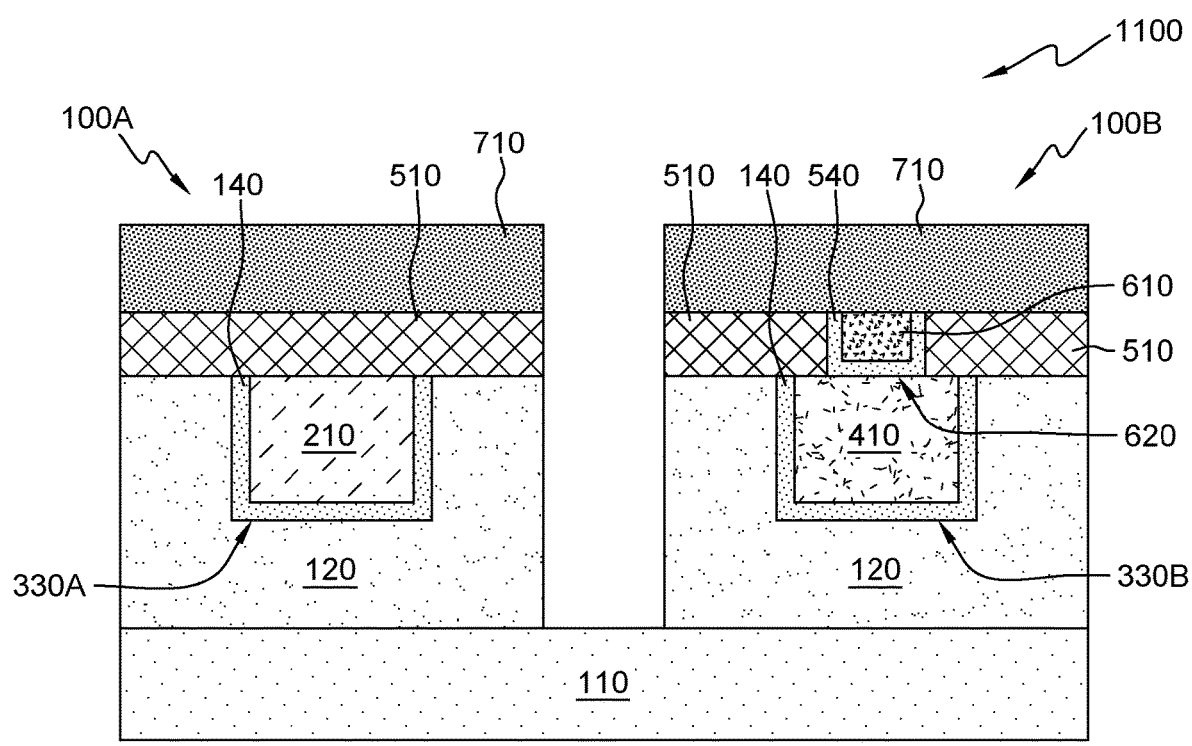
FIG. 11 illustrates a cross-sectional view of semiconductor structure 1000 depicted in FIG. 10 after subsequent processing steps, generally designated 1100, in accordance with at least one embodiment of the present invention.

FIG. 11 illustrates a cross-sectional view of semiconductor structure 1000 depicted in FIG. 10 after subsequent process steps, generally designated 1100, in accordance with at least one embodiment of the present invention. Semiconductor structure 1100 of FIG. 11 is obtained following formation of a memory stack 710 onto the exposed surfaces of logic area 100A and memory area 100B of semiconductor structure 1000 depicted in FIG. 10.

In some embodiments, memory stack 710 is composed of an electrically conductive metal or a metal alloy (e.g., copper (Cu), aluminum (Al), tungsten (W), cobalt (Co), ruthenium (Ru), nickel (Ni), iridium (Jr), rhodium (Rh) or an alloy thereof such as, for example, a Cu—Al alloy). In such embodiments, the electrically conductive metal or metal alloy that forms memory stack 710 may be the same as, or different from, the electrically conductive metal or metal alloy used to form bottom interconnect 330B. The electrically conductive metal or metal alloy that forms memory stack 710 may be formed utilizing one of the deposition processes used to deposit metal liner 140 or metal filler 210 as previously described above.

In other embodiments, memory stack 710 is composed of an electrically conductive metal-containing material stack layer which may be used as a non-volatile memory device such as, for example, a ferroelectric memory (FE) device, a resistive random access memory (ReRAM) device, a magnetoresistive random access memory (MRAM) device, or a phase change random access memory (PRAM) device.

A FE memory device is a random access memory similar in construction to a DRAM by using a ferroelectric layer instead of a dielectric layer to achieved non-volatility. FE memory devices typically include a material stack of, from bottom to top, a bottom electrode, a ferroelectric layer, and a top electrode. The bottom and top electrodes may be composed of a metal or metal nitride. For example, TiN may be used as the material for both the bottom and top electrodes. The ferroelectric layer is composed of one or more ferroelectric materials exhibiting ferroelectricity (i.e., a material that has a spontaneous electric polarization that can be reversed by the application of an external electric field). Examples of ferroelectric materials that can be used as the ferroelectric layer include, but at not limited to, mixed metal oxides such as, $BaTiO_3$, $Pb(Zr_xTi_{1-x})O_3$ ($0.1 \leq x \leq 1$), or crystalline $HfO_2$ with, or without, a doping element selected from Zr, Al, Ca, Ce, Dy, Er, Gd, Ge, La, Sc, Si, Sr, Sn, C, N, and Y. The FE material stack can be formed by deposition of the various material layers.

A ReRAM device is a random access memory that typically includes a material stack of, from bottom to top, a bottom electrode, a metal oxide that can exhibit a change in electron localization, and a top electrode. The bottom and top electrodes may be composed of a metal or metal nitride. For example, TiN may be used as the material for both the bottom and top electrodes. The metal oxide may include oxides of nickel, zirconium, hafnium, iron, or copper. The ReRAM material stack can be formed by deposition of the various material layers.

A MRAM device is a random access memory, that includes a magnetic tunnel junction (MTJ) structure The magnetic tunnel junction (MTJ) structure may include a magnetic reference layer, a tunnel barrier, and a magnetic free layer. The magnetic reference layer has a fixed magnetization. The magnetic reference layer may be composed of a metal or metal alloy that includes one or more metals exhibiting high spin polarization. In alternative embodiments, exemplary metals for the formation of the magnetic reference layer include iron, nickel, cobalt, chromium, boron, and manganese. Exemplary metal alloys may include the metals exemplified by the above. In another embodiment, the magnetic reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier of the MTJ structure is composed of an insulator material and is formed at such a thickness as to provide an appropriate tunneling resistance. Exemplary materials for the tunnel barrier include magnesium oxide, aluminum oxide, and titanium oxide, or materials of higher electrical tunnel conductance, such as semiconductors or low-bandgap insulators.

The magnetic free layer of the MTJ structure is composed of at least one magnetic material with a magnetization that can be changed in orientation relative to the magnetization orientation of the reference layer. Exemplary materials for the free layer of the MTJ structure include alloys and/or multilayers of cobalt, iron, alloys of cobalt-iron, nickel, alloys of nickel-iron, and alloys of cobalt-iron-boron. The MTJ structure of the MRAM device can be formed by deposition of the various material layers.

A PRAM device is a random access memory that typically includes a material stack of, from bottom to top, a bottom electrode, a phase change memory material that exhibits a change in atomic order (from crystalline to amorphous or vice versa), and a top electrode. The bottom and top electrodes may be composed of a metal or metal nitride. For example, TiN may be used as the material for both the bottom and top electrodes. The phase change memory material may include a chalcogenide glass such as, for example, $Ge_2Sb_2Te_5$ or $Ge_2Bi_2Te_6$. The PRAM stack can be formed by deposition of the various material layers.

Figure 12:
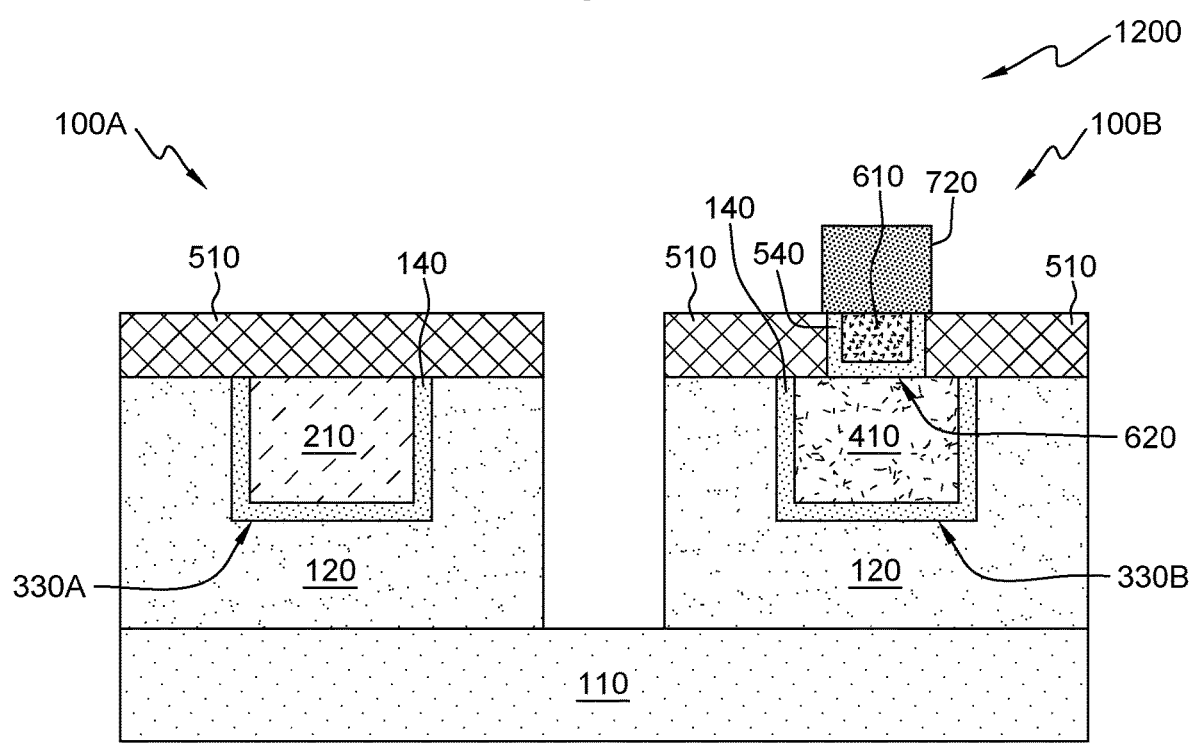
FIG. 12 illustrates a cross-sectional view of semiconductor structure 1100 depicted in FIG. 11 after subsequent processing steps, generally designated 1200, in accordance with at least one embodiment of the present invention.

FIG. 12 illustrates a cross-sectional view of semiconductor structure 1100 depicted in FIG. 11 after subsequent process steps, generally designated 1200, in accordance with at least one embodiment of the present invention. Semiconductor structure 1200 is obtained following pattering of memory stack 710 (depicted in FIG. 11) to form a memory device pillar 720 (also referred to herein as a memory device) in memory area 100B. Memory device pillar 720 can be any memory device as defined above.

Following the formation of memory stack 710, a patterned hard mask (not depicted) is formed by depositing a hard mask layer (not depicted) on memory stack 710 and patterning the hard mask using the process previously described above with reference to FIG. 9.

The patterned hard mask may be composed of any metal-containing hard mask material such as, for example, titanium nitride or tantalum nitride. The patterned hard mask may have a thickness from 20 nm to 150 nm. However, other thicknesses that are less than 20 nm, and greater than 150 nm can also be employed in embodiments of the present invention.

The resulting patterned hard mask is formed such that a portion of the underlying structure of memory area 100B corresponding to memory device pillar 720 to be formed is protected by the patterned hard mask, while the remaining portions of the underlying structure of memory area 100B and the entire underlying structure of memory area 100B are left exposed.

The patterning of memory stack layer 710 to form memory device pillar 720 includes an anisotropic etching process such as, for example, reactive ion etching (REI) ion beam etching (IBE), chemical wet etching or a combination of ion beam etching and chemical wet etching. The etch removes portions of memory stack 710 that are not located under the patterned hard mask. The remaining, i.e., non-etched, portion of memory stack 710 that is located under the patterned hard mask constitutes memory device pillar 720.

After forming memory device pillar 720, the patterned hard mask can be removed utilizing one or more material removal processes. For example, the patterned hard mask can be removed utilizing a planarization process such as, for example, chemical mechanical polishing and/or grinding.

Figure 13:
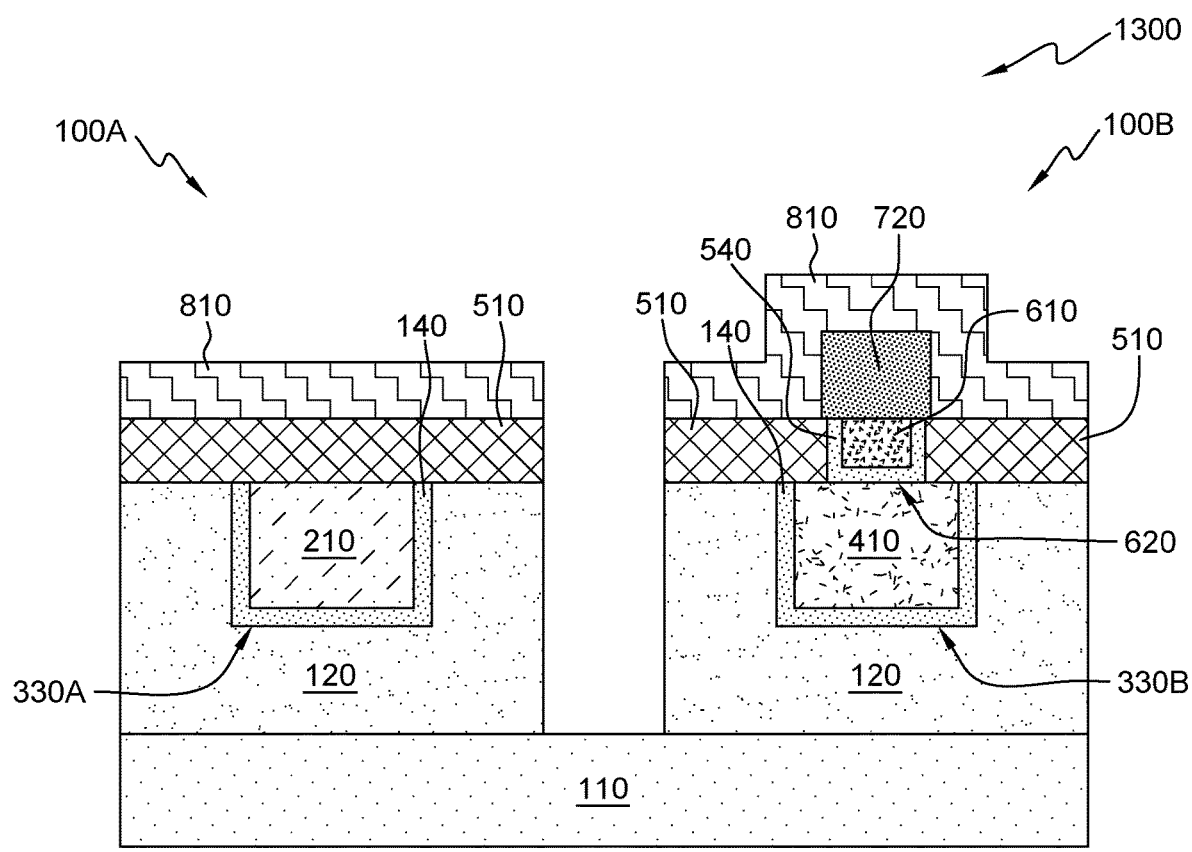
FIG. 13 illustrates a cross-sectional view of semiconductor structure 1200 depicted in FIG. 12 after subsequent processing steps, generally designated 1300, in accordance with at least one embodiment of the present invention.

FIG. 13 illustrates a cross-sectional view of semiconductor structure 1200 depicted in FIG. 12 after subsequent process steps, generally designated 1300, in accordance with at least one embodiment of the present invention. Semiconductor structure 1300 of FIG. 13 is obtained following the conformal deposition of a spacer layer 810 onto the exposed surfaces of semiconductor structure 1200 of FIG. 12.

As depicted by semiconductor structure 1300 of FIG. 13, spacer layer 810 has been conformally deposited onto the exposed surfaces (including the surface of insulator layer 510) of logic area 100A, and the exposed surfaces of memory area 100B (including the surface of insulator layer 510 and the surfaces of memory device pillar 720). Spacer layer 810 can be composed of any insulator material including, but not limited to, silicon dioxides (SiO2), silicon nitrides (Si3N4), silicon carbides (SiC), nitrogen-hydrogen doped silicon carbides (SiC)(N,H), or any other insulators which are suitable for the given application. Spacer layer 810 can be formed utilizing a deposition process such as, for example, chemical vapor deposition, plasma enhanced chemical vapor deposition or physical vapor deposition. Spacer layer 810 can have a thickness from 20 nm to 800 nm. However, other thicknesses that are less than 20 nm, and greater than 800 nm can also be employed in embodiments of the present invention.

Figure 14:
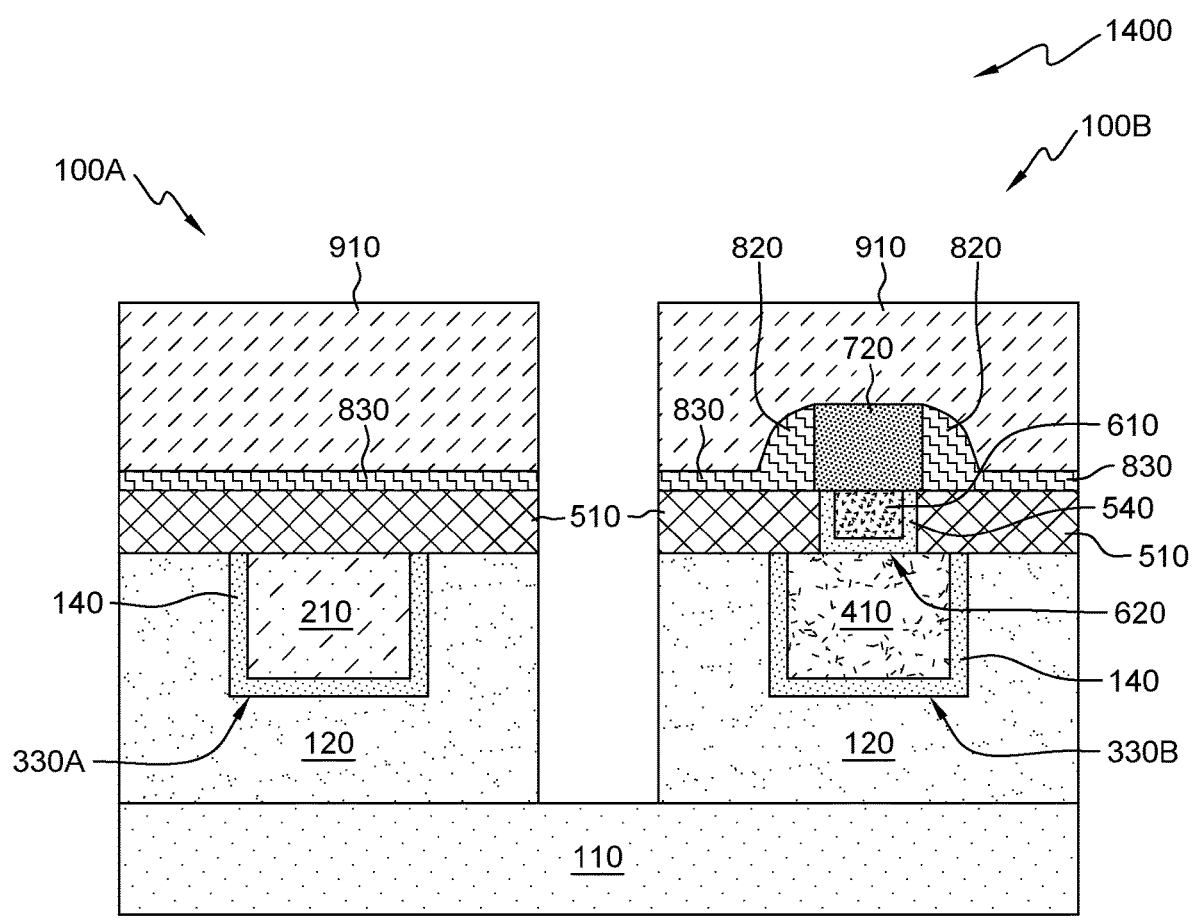
FIG. 14 illustrates a cross-sectional view of semiconductor structure 1300 depicted in FIG. 13 after subsequent processing steps, generally designated 1400, in accordance with at least one embodiment of the present invention.

FIG. 14 illustrates a cross-sectional view of semiconductor structure 1300 depicted in FIG. 13 after subsequent processing steps, generally designated 1400, in accordance with at least one embodiment of the present invention. As depicted by semiconductor structure 1400 of FIG. 14, a spacer 820 and a spacer retention layer 830 are formed after subjecting spacer layer 810 (depicted in FIG. 13) to a "partial" etch back process. In an embodiment, spacer 820 and spacer retention layer 830 are formed, for example, by at least one of directional etching (e.g., reactive ion etch (RIE)) and over etching (e.g., RIE over etch). Spacer 820 is located laterally adjacent to a sidewall of memory device pillar 720 and horizontally adjacent to the top surface of a portion of insulator layer 510. Spacer 820 encircles memory device pillar 720 and has a bottom surface that is located on a portion of the top surface of insulator layer 510 of memory area 100B. Spacer retention layer 830 abuts a vertical portion of spacer 820 and has a bottom surface that is located on a portion of the top surface of insulator layer 510 of logic area 100A and memory area 100B.

Following forming spacer 820 and spacer retention layer 830 from spacer layer 810 using the "partial" etch back process, a dielectric layer 910 is conformally deposited onto the exposed surfaces of memory device pillar 720, spacer 820, and spacer retention layer 830. Dielectric layer 910 can include one of the dielectric materials mentioned above for dielectric layer 120. In some embodiments, dielectric layer 910 is composed of a same dielectric material as dielectric layer 120. In other embodiments, dielectric layer 910 is composed of a dielectric material that is compositionally different from the dielectric material used to form dielectric layer 120. Dielectric layer 910 may be formed utilizing one of the deposition processes mentioned above in forming dielectric layer 120. Dielectric layer 910 has a thickness that can be in the thickness range mentioned above for dielectric layer 120.

Figure 15:
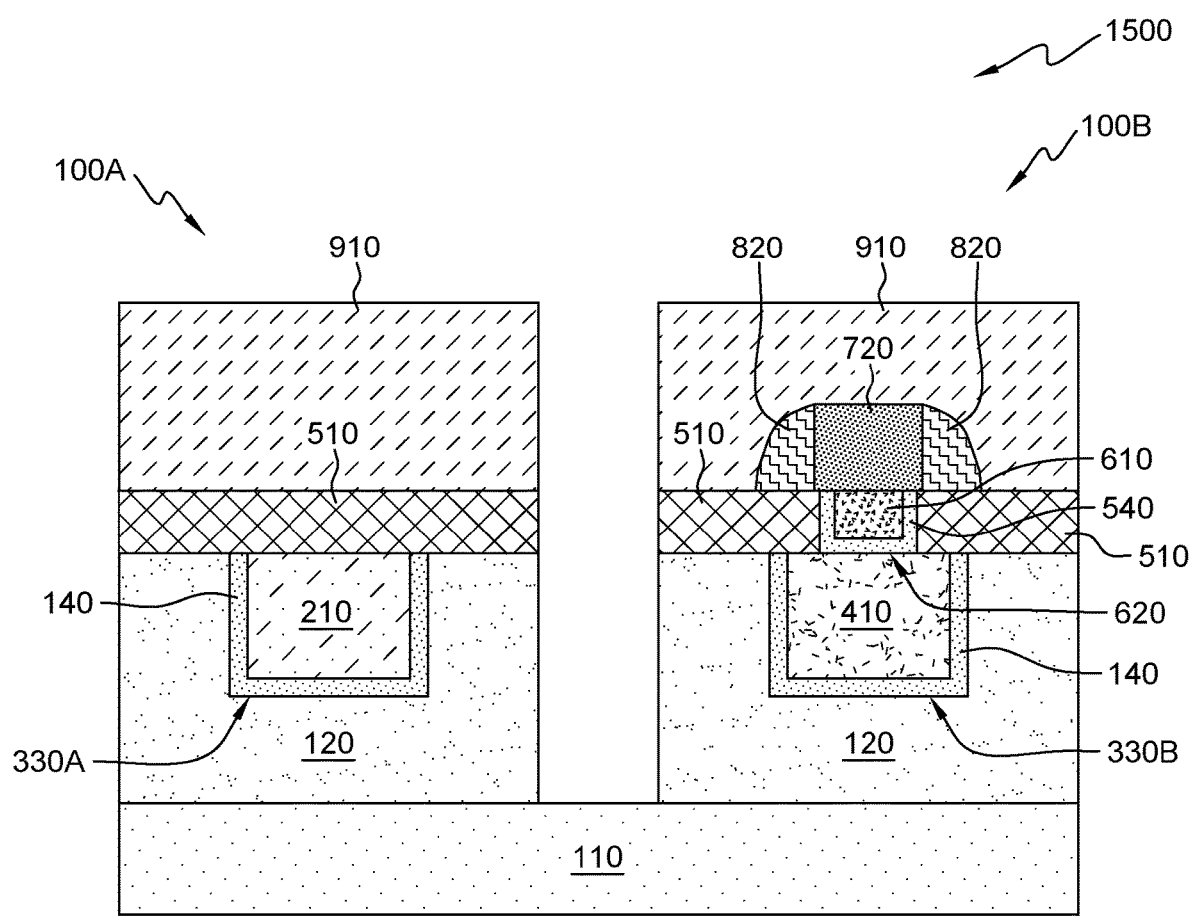
FIG. 15 illustrates a cross-sectional view of semiconductor structure 1300 depicted in FIG. 13 after alternative subsequent processing steps, generally designated 1500, in accordance with at least one embodiment of the present invention.

FIG. 15 illustrates a cross-sectional view of semiconductor structure 1300 depicted in FIG. 13 after alternative subsequent processing steps, generally designated 1500, in accordance with at least one embodiment of the present invention. As depicted by the semiconductor structure 1500 of FIG. 15, spacer 820 is formed after subjecting spacer layer 810 (depicted in FIG. 13) to a "full" etch back process. The "full" etch back process results in the elimination of spacer retention layer 830 (depicted in FIG. 14) from logic area 100A and memory area 100B. In an embodiment, spacer 820 is formed, for example, by at least one of directional etching (e.g., reactive ion etch (RIE)) and over etching (e.g., RIE over etch). Spacer 820 is located laterally adjacent to a sidewall of memory device pillar, and horizontally adjacent to the top surface of a portion of insulator layer 510 of memory area 100B. Spacer 820 encircles memory device pillar 720 and has a bottom surface that is located on a portion of the top surface of insulator layer 510 of memory area 100B.

Following forming spacer 820 from spacer layer 810 using the "full" etch back process, a dielectric layer 910 is conformally deposited onto the exposed surfaces of insulator 510, memory device pillar 720, and spacer 820. Dielectric layer 910 can include one of the dielectric materials mentioned above for dielectric layer 120. In some embodiments, dielectric layer 910 is composed of a same dielectric material as dielectric layer 120. In other embodiments, dielectric layer 910 is composed of a dielectric material that is compositionally different from the dielectric material used to form dielectric layer 120. Dielectric layer 910 may be formed utilizing one of the deposition processes mentioned above in forming dielectric layer 120. Dielectric layer 910 has a thickness that can be in the thickness range mentioned above for dielectric layer 120.

Figure 16:
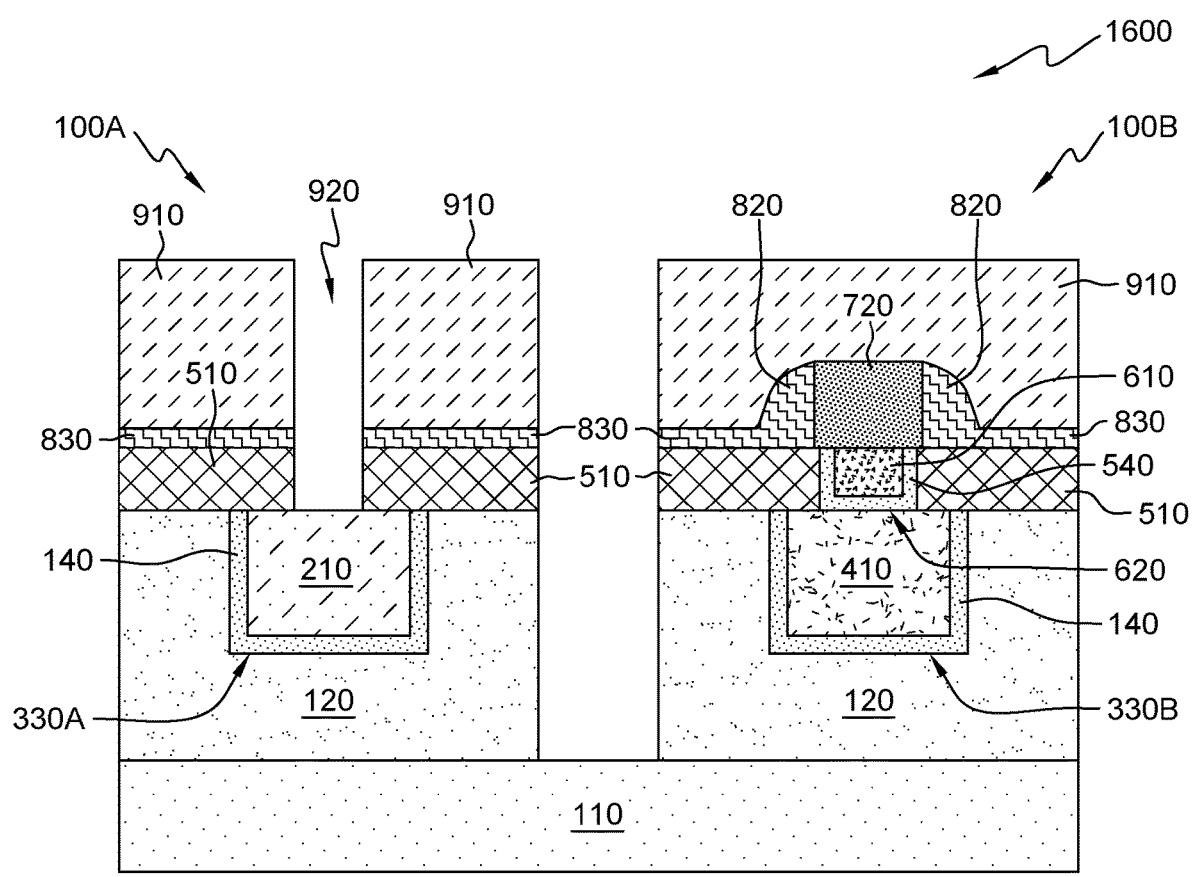
FIG. 16 illustrates a cross-sectional view of semiconductor structure 1400 depicted in FIG. 14 after subsequent processing steps, generally designated 1600, in accordance with at least one embodiment of the present invention.

FIG. 16 illustrates a cross-sectional view of semiconductor structure 1400 depicted in FIG. 14 after subsequent processing steps, generally designated 1600, in accordance with at least one embodiment of the present invention. It should be noted that although the subsequent processing steps as depicted in FIGS. 16-18 are directed towards the semiconductor structure 1400 of FIG. 14, embodiments of the present invention can be practiced such that the same processing steps as depicted in FIGS. 16-18 can be applied to the semiconductor structure 1500 of FIG. 15.

As depicted by semiconductor structure 1600 of FIG. 16, an opening 920 is formed in dielectric layer 910, spacer retention layer 830, and insulator layer 510 of logic area 100A. Opening 920 extends vertically downwardly through a portion of dielectric layer 910, spacer retention layer 830, and insulator layer 510 and exposes at least a portion of the top surface of bottom interconnect 130A of logic area 100A. In an embodiment, opening 920 is formed using lithography and etching processes previously mentioned above to form openings 130A and 130B. In an embodiment, and as depicted by semiconductor structure 1600, opening 920 is a via.

Figure 17:
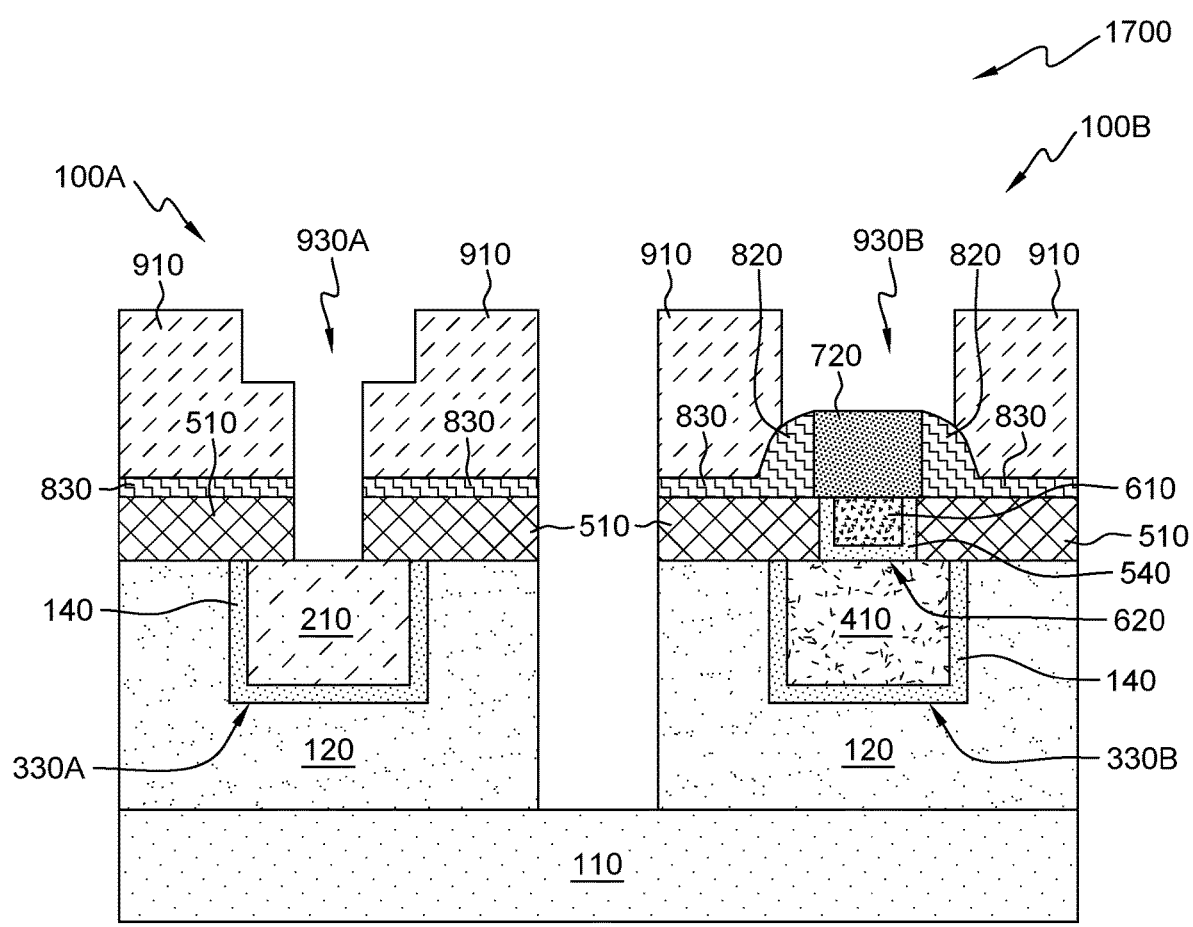
FIG. 17 illustrates a cross-sectional view of semiconductor structure 1600 depicted in FIG. 16 after subsequent processing steps, generally designated 1700, in accordance with at least one embodiment of the present invention.

FIG. 17 illustrates a cross-sectional view of semiconductor structure 1600 depicted in FIG. 16 after subsequent processing steps, generally designated 1700, in accordance with at least one embodiment of the present invention. In an embodiment, openings 930A and 930B are formed using lithography and etching processes previously mentioned above to form openings 130A and 130B. In some embodiments, and as depicted by semiconductor structure of FIG. 17, openings 930A and 930B are simultaneously formed in dielectric layer 910 of logic area 100A and memory area 100B. In alternative embodiments, only opening 930B is formed in dielectric layer 910 of memory area 100B. In an embodiment, and as depicted by semiconductor structure 1700, opening 930A is a line/via (i.e., trench/via) and opening 930B is a line (i.e., trench). However, alternative embodiments can be practiced such that openings 930A and 930B are vias, lines, line/vias, or any possible combination thereof.

Figure 18:
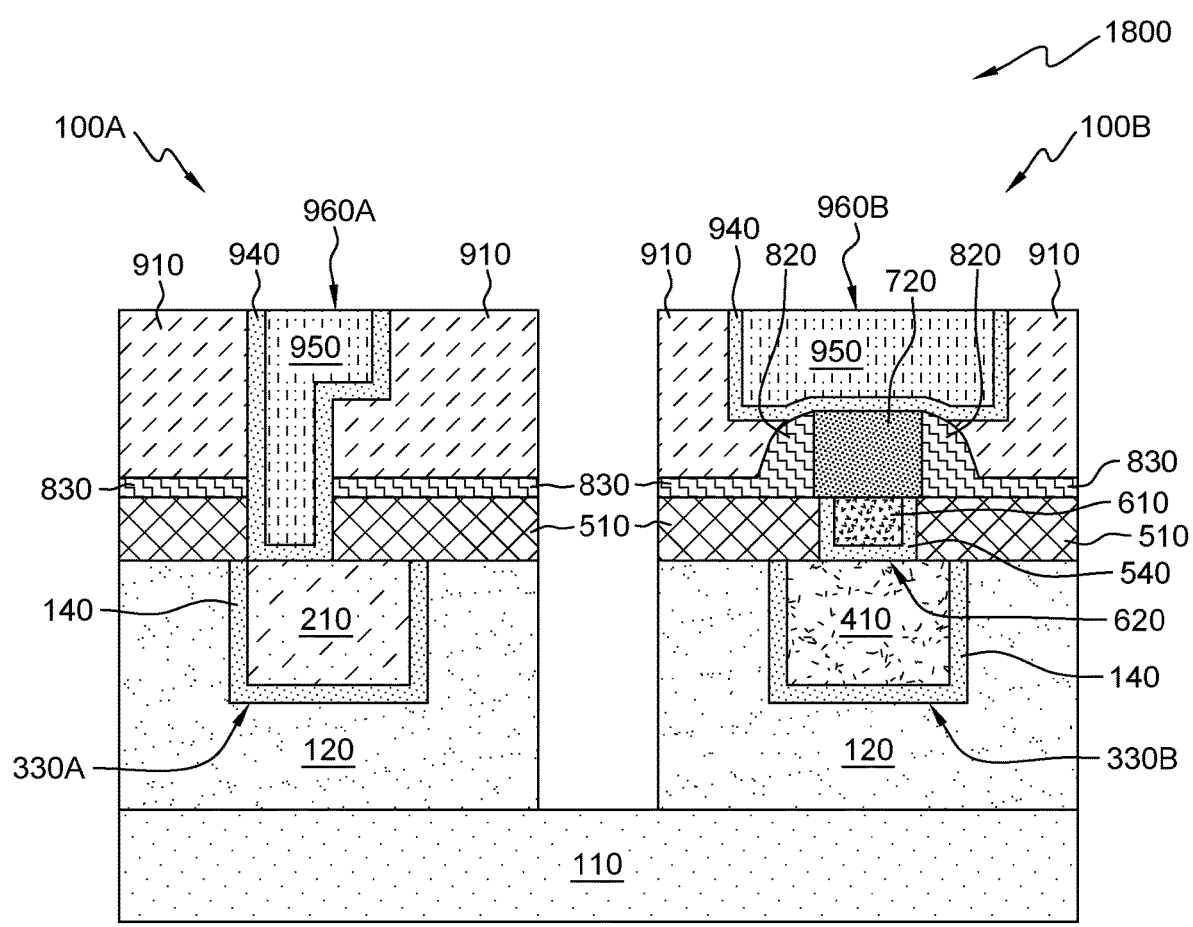
FIG. 18 illustrates a cross-sectional view of semiconductor structure 1700 depicted in FIG. 17 after subsequent processing steps, generally designated 1800, in accordance with at least one embodiment of the present invention.

FIG. 18 illustrates a cross-sectional view of structure 1700 depicted in FIG. 17 after subsequent processing steps, generally designated 1800, in accordance with at least one embodiment of the present invention. As depicted by structure 1800 of FIG. 18, top interconnects 960A and 960B are formed within openings 930A and 930B (depicted in FIG. 17) of logic area 100A and memory area 100B, respectively.

Top interconnects 960A and 960B are formed by initially forming an optional metal liner 940 onto the exposed surfaces of logic layer 100A and memory area 100B prior to filling openings 930A and 930B with a conductive metal or metal alloy. Metal liner 940 can include one of the metal liner materials mentioned above for metal liner layer 140. Metal liner 940 may be formed utilizing one of the deposition processes mentioned above in forming metal liner 140. Metal liner 940 has a thickness that can be in the thickness range mentioned above for metal liner 140.

After forming metal liner 940, a metal filler 950 is simultaneously deposited (e.g., via atomic layer deposition, chemical vapor deposition, plating, electroplating, or any other suitable deposition techniques) on the exposed surfaces of metal liner 940 in logic area 100A and memory area 100B. Specifically, metal filler 950 is formed such that openings 930A and 930B are filled with metal filler 950 until metal filler 950 is at least substantially coplanar with a top surface of dielectric layer 910. Top interconnects 960A and 960B may be composed of an electrically conductive material such as, for example, an electrically conductive metal, an electrically conductive metal alloy or an electrically conductive metal nitride. Examples of electrically conductive metals that can be used to form top interconnects 960A and 960B can include, but are not limited to, copper (Cu), ruthenium (Ru), cobalt (Co), rhodium (Rh), tungsten (W), aluminum (Al), tantalum (Ta) or titanium (Ti). An electrically conductive metal alloy that can be used to form top interconnects 960A and 960B may be, for example Cu—Al. An electrically conductive metal nitride that can be used to form top interconnects 960A and 960B may be, for example, TaN or TiN. Top interconnects 960A and 960B can be composed of a single electrically conductive material or a multilayered stack of electrically conductive materials. Top interconnects 960A and 960B can be formed using one of the deposition processes mentioned above for forming metal filler 210 within openings 130A and 130B (depicted in FIG. 3).

In those embodiments in which metal liner 940 is not used, metal filler 950 is deposited directly onto the exposed surfaces of logic area 100A and memory area 100B. In an embodiment, a thermal annealing process as previously mentioned above with reference to metal filler 210 is performed after metal filler 950 is formed within and filling openings 930A and 930B. A planarization process, such as for example, chemical mechanical polishing and/or grinding can be used to remove any excess electrically conducive metal containing material (and if present, any excess metal liner) that is present outside of openings 930A and 930B used to form top interconnects 960A and 960B, and on the top surface of dielectric layer 910. Following the planarization process, the top surface of top interconnects 960A and 960B is substantially coplanar with the top surface of dielectric layer 910.

In some embodiments, and as depicted by semiconductor structure 1800, top interconnect 960A includes metal liner 940 and metal filler 950, and has a bottom surface that contacts at least a portion of the top surface of bottom interconnect 330A. In some embodiments, and as depicted by semiconductor structure 1800, top interconnect 960B includes metal liner 940 and metal filler 950, and has a bottom surface that contacts at least the top surface of patterned memory stack 720. In some embodiments, and as depicted by semiconductor structure 1800, top interconnect 960B has at least one surface that contacts at least one surface of patterned memory stack 720. Top interconnect 960B is in direct physical contact with top surface of patterned memory stack 720 and at least a portion of the top surface of spacer 820.

According to one embodiment of the present invention, a method of simultaneously forming a logic area and a memory area of a semiconductor device is disclosed. The method comprises: forming a first bottom interconnect and a second bottom interconnect in a first dielectric layer, wherein the first bottom interconnect and the second bottom interconnect formed in the first dielectric layer are located in a logic area and a memory area, respectively, of the semiconductor device, and the first bottom interconnect located in the logic area is formed from a first metal material that is different than a second metal material used to form the second bottom interconnect located in the memory area; and forming a memory device on top of the second bottom interconnect located in the memory area.

In an embodiment, the first metal material used to fill the first opening in the first dielectric layer located in the logic area and the second metal material used to fill the second opening in the first dielectric layer located in the memory area are non-ferromagnetic.

In an embodiment, the first metal material used to fill the first opening in the first dielectric layer located in the logic area is ferromagnetic and the second metal material used to fill the second opening in the second dielectric layer located in the memory area is non-ferromagnetic.

In an embodiment, forming the first bottom interconnect and the second bottom interconnect in the first dielectric layer further includes: simultaneously forming a first opening in the first dielectric layer located in the logic area and a second opening in the dielectric layer corresponding to the first bottom interconnect and second bottom interconnect, respectively; and simultaneously filling the first opening and the second opening with the first metal material.

In an embodiment, the method of simultaneously forming a logic area and a memory area of a semiconductor device further comprises: selectively removing the first metal material filling the second opening in the first dielectric layer located in the memory area; and refilling the second opening in the first dielectric layer located in the memory area with a second metal material.

In an embodiment, forming the memory device above the second bottom interconnect located in the memory area further includes: depositing an insulator on top of the first dielectric layer and on top of the first and second bottom interconnects located within the logic and memory areas, respectively, of the semiconductor device; forming a metal plug within the insulator layer and on top of the second bottom interconnect located in the memory area; forming a memory device pillar on top of the metal plug; and forming a spacer surrounding a sidewall of the memory device pillar.

In an embodiment, forming the spacer surrounding the sidewall of the memory device pillar includes: simultaneously depositing a spacer material layer onto exposed surfaces of the logic and memory areas, respectively, of the semiconductor device; and performing a partial etch back of the spacer insulator material deposited onto the exposed surfaces of the memory area to form the spacer surrounding the sidewall of the memory device pillar.

In an embodiment, the method of simultaneously forming a logic area and a memory area of a semiconductor device further comprises: depositing a second dielectric layer on top of any exposed surfaces in the logic area and memory, respectively, of the semiconductor device; and simultaneously forming a first top interconnect in the second dielectric layer located in the logic area and a second top interconnect in the second dielectric layer located in the memory area, wherein: the first top interconnect is formed on top of the first bottom interconnect located in the logic area; and the second top interconnect is formed on top of the memory device pillar located in the memory area.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

What is claimed is:

1. A method of forming a semiconductor device, comprising:
    forming a first bottom interconnect and a second bottom interconnect in a first dielectric layer, wherein:
        the first bottom interconnect and the second bottom interconnect formed in the first dielectric layer are located in a logic area and a memory area, respectively, of the semiconductor device; and
        the first bottom interconnect located in the logic area is formed from a first metal material that is different than a second metal material used to form the second bottom interconnect located in the memory area;
    forming a metal plug on top of the second bottom interconnect located within the memory area of the semiconductor device; and
    forming a memory device pillar on top of the metal plug.

2. The method of claim 1, wherein the first metal material used to fill the first opening in the first dielectric layer located in the logic area and the second metal material used to fill the second opening in the first dielectric layer located in the memory area are non-ferromagnetic.

3. The method of claim 1, wherein the first metal material used to fill the first opening in the first dielectric layer located in the logic area is ferromagnetic and the second metal material used to fill the second opening in the second dielectric layer located in the memory area is non-ferromagnetic.

4. The method of claim 1, wherein forming the first bottom interconnect and the second bottom interconnect in the first dielectric layer further includes:
    simultaneously forming a first opening in the first dielectric layer located in the logic area and a second opening in the dielectric layer corresponding to the first bottom interconnect and second bottom interconnect, respectively; and simultaneously filling the first opening and the second opening with the first metal material.

5. The method of claim 4, further comprising:

selectively removing the first metal material filling the second opening in the first dielectric layer located in the memory area; and refilling the second opening in the first dielectric layer located in the memory area with a second metal material.

6. The method of claim 1, wherein forming the memory device pillar above the second bottom interconnect located in the memory area further includes:

depositing an insulator on top of the first dielectric layer and on top of the first and second bottom interconnects located within the logic and memory areas, respectively, of the semiconductor device;

forming the metal plug within the insulator; and forming a spacer surrounding a sidewall of the memory device pillar.

7. The method of claim 6, wherein forming the spacer surrounding the sidewall of the memory device pillar includes:

simultaneously depositing a spacer material layer onto exposed surfaces of the logic and memory areas, respectively, of the semiconductor device; and performing a partial etch back of the spacer insulator material deposited onto the exposed surfaces of the memory area to form the spacer surrounding the sidewall of the memory device pillar.

8. The method of claim 6, further comprising:

depositing a second dielectric layer on top of any exposed surfaces in the logic and memory areas, respectively, of the semiconductor device; and simultaneously forming a first top interconnect in the second dielectric layer located in the logic area and a second top interconnect in the second dielectric layer located in the memory area, wherein:

the first top interconnect is formed on top of the first bottom interconnect located in the logic area; and the second top interconnect is formed on top of the memory device pillar located in the memory area.

9. A semiconductor device, comprising:

a first bottom interconnect formed within a first dielectric layer and located within a logic area of the semiconductor device;

a second bottom interconnect formed within the first dielectric layer and located within a memory area of the semiconductor device;

a metal plug formed on top of the second bottom interconnect located within the memory area of the semiconductor device; and a memory device pillar formed on top of the metal plug, wherein:

a first metal material used to form the first bottom interconnect located in the logic area is different than a second metal material used to form the second bottom interconnect located in the memory area.

10. The semiconductor device of claim 9, wherein the first metal material used to form the first bottom interconnect located in the logic area and the second metal material used to form the second bottom interconnect located in the memory area are non-ferromagnetic.

11. The semiconductor device of claim 9, wherein the first metal material used to form the first bottom interconnect located in the logic area is ferromagnetic and the second metal material used to form the second bottom interconnect located in the memory area is non-ferromagnetic.

12. The semiconductor device of claim 9, wherein the first bottom interconnect and the second bottom interconnect are local interconnects.

13. The semiconductor device of claim 9, wherein a top surface of the first bottom interconnect formed in the first dielectric layer and located in the logic area is substantially coplanar with a top surface of the second bottom interconnect formed in the first dielectric layer and located in the memory area.

14. The semiconductor device of claim 9, further comprising a metal liner separating the first and second bottom interconnects from the first dielectric layer, respectively.

15. The semiconductor device of claim 9, further comprising:

an insulator layer formed on top of the first dielectric layer and on top of the first and second bottom interconnects located within the logic and memory areas, respectively, of the semiconductor device; and a spacer surrounding a sidewall of the memory device pillar, wherein the metal plug is formed within the insulator layer.

16. The semiconductor device of claim 15, wherein a layer of spacer material used to form the spacer surrounding the sidewall of the memory device pillar remains on top of exposed surfaces of the logic and memory areas, except for a top surface of the memory device pillar.

17. The semiconductor device of claim 15, wherein a layer of spacer material used to form the spacer surrounding the sidewall of the memory device pillar remains at a field area of the logic area and the memory area, respectively.

18. The semiconductor device of claim 15, further comprising:

a second dielectric layer formed on top of exposed surfaces of the logic and memory areas, respectively, of the semiconductor device;

a first top interconnect formed within the second dielectric layer and the insulator layer, and on top of the first bottom interconnect located in the logic area; and a second top interconnect formed within the second dielectric layer, and on top of the memory device pillar and at least a portion of the spacer surrounding the sidewall of the memory device pillar.

19. The semiconductor device of claim 18, wherein a bottom surface of the first top interconnect formed within the second dielectric layer and located within the logic area is substantially coplanar with a bottom surface of the second top interconnect formed within the second dielectric layer and located within the memory area.

20. The semiconductor device of claim 18, wherein the first top interconnect formed within the second dielectric layer and located within the logic area is formed from a same metal material as the second top interconnect formed within the second dielectric layer and located within the memory area.

* * * * *